United States Patent
Park et al.

(10) Patent No.: US 9,062,244 B2
(45) Date of Patent: Jun. 23, 2015

(54) ETCHING COMPOSITION AND METHOD OF MANUFACTURING A DISPLAY SUBSTRATE USING THE SYSTEM

(75) Inventors: Hong-Sick Park, Suwon-Si (KR); Wang-Woo Lee, Suwon-Si (KR); Bong-Kyun Kim, Hwaseong-si (KR); O-Byoung Kwon, Jeonju-si (KR); Kyung-Bo Shim, Jeonju-si (KR); Sang-Hoon Jang, Jeonju-si (KR)

(73) Assignees: SAMSUNG DISPLAY CO., LTD. (KR); DONGWOO FINE-CHEM CO., LTD. (KR)

( * ) Notice: Subject to any disclaimer, the term of this patent is extended or adjusted under 35 U.S.C. 154(b) by 297 days.

(21) Appl. No.: 13/534,502

(22) Filed: Jun. 27, 2012

(65) Prior Publication Data
US 2013/0115727 A1 May 9, 2013

(30) Foreign Application Priority Data
Nov. 8, 2011 (KR) .................. 10-2011-0115783

(51) Int. Cl.
| | | |
|---|---|---|
| H01L 21/302 | (2006.01) | |
| H01L 21/461 | (2006.01) | |
| C09K 13/04 | (2006.01) | |
| C23F 1/18 | (2006.01) | |
| C23F 1/02 | (2006.01) | |
| C23F 1/38 | (2006.01) | |
| C23F 1/44 | (2006.01) | |
| C09K 13/08 | (2006.01) | |
| H01L 21/3213 | (2006.01) | |
| H01L 27/12 | (2006.01) | |

(52) U.S. Cl.
CPC . *C09K 13/04* (2013.01); *C23F 1/18* (2013.01); *C23F 1/02* (2013.01); *C23F 1/38* (2013.01); *C23F 1/44* (2013.01); *C09K 13/08* (2013.01); *H01L 21/32134* (2013.01); *H01L 27/124* (2013.01); *H01L 27/1288* (2013.01)

(58) Field of Classification Search
USPC .................................. 438/689, 745, 669, 754
See application file for complete search history.

(56) References Cited

U.S. PATENT DOCUMENTS

| | | | |
|---|---|---|---|
| 7,582,217 B2* | 9/2009 | Lee et al. ........................... | 216/5 |
| 2010/0285640 A1* | 11/2010 | Chae et al. .................... | 438/158 |
| 2012/0052609 A1* | 3/2012 | Jeong et al. ..................... | 438/34 |

* cited by examiner

*Primary Examiner* — Thien F Tran
(74) *Attorney, Agent, or Firm* — Innovation Counsel LLP

(57) ABSTRACT

An etching composition and a method of manufacturing a display substrate using the etching composition are disclosed. The etching composition includes phosphoric acid ($H_3PO_4$) of about 40% by weight to about 70% by weight, nitric acid ($HNO_3$) of about 5% by weight to about 15% by weight, acetic acid ($CH_3COOH$) of about 5% by weight to about 20% by weight, and a remainder of water. Thus, a metal layer including copper may be stably etched.

13 Claims, 5 Drawing Sheets

ETCHING COMPOSITION AND METHOD OF MANUFACTURING A DISPLAY SUBSTRATE USING THE SYSTEM

PRIORITY STATEMENT

This application claims priority under 35 U.S.C. §119 to Korean Patent Application No. 10-2011-0115783, filed on Nov. 8, 2011 in the Korean Intellectual Property Office (KIPO), the contents of which are herein incorporated by reference in its entirety.

BACKGROUND OF THE INVENTION

1. Field of the Invention

Example embodiments relate to an etching composition and a method of manufacturing a display substrate using the etching composition. More particularly, example embodiments relate to an etching composition used for etching a copper layer and a method of manufacturing a display substrate using the etching composition.

2. Description of the Related Art

Generally, a display substrate used in a display apparatus includes a thin-film transistor ("TFT") as a switching element for driving a pixel, signal lines connected to the TFT, and a pixel electrode. The signal lines include a gate line transmitting a gate driving signal and a data line transmitting a data driving signal.

As the size of display apparatuses increases and also customer's requirements that display apparatuses have high resolution, the length of the gate and data lines is increased while at the same time the width of the gate and lines is decreased, and as a result electric resistance is increased. Thus, a resistance-capacitance ("RC") signal delay is caused. In order to solve this RC signal delay problem, gate and data lines are formed from a metal having a relatively low resistance. Copper is a metal having a relatively low resistance and when used for forming gate and data lines has excellent electric conductivity and has a resistance much lower than aluminum or chrome. Furthermore, copper is relatively abundant as a natural resource. However, the resistance of copper against an oxidizer is higher than that of aluminum or chrome, so that a strong oxidizer is required for etching a copper layer when forming signal lines.

Copper etchants that include a strong oxidizer are effective for etching the copper layer, however, patterns previously formed in prior processes may be easily damaged from such a copper etchant. A conventional peroxide-based etchant is sometimes replaced with an etchant including a persulfuric acid-based compound as a main etching element to reduce etching of patterns previously formed in prior processes when etching the copper layer. However, such an etchant is unstable when stored at a room temperature, and has a limitation to maximize a number of substrates treated by the etchant.

SUMMARY OF THE INVENTION

An etching composition for a copper layer having high storage stability at a room temperature and capable of increasing a number of treating substrates is provided.

A method of manufacturing a display substrate using the etching composition is also provided.

According to one aspect, an etching composition includes phosphoric acid ($H_3PO_4$) of about 40% by weight to about 70% by weight, nitric acid ($HNO_3$) of about 5% by weight to about 15% by weight, acetic acid ($CH_3COOH$) of about 5% by weight to about 20% by weight, and a remainder of water.

In another aspect, an amount of phosphoric acid may be between about 40% by weight and about 45% by weight, an amount of nitric acid may be between about 10% by weight and about 13% by weight, an amount of acetic acid may be between about 12% by weight and about 15% by weight, and an amount of water may be between about 27% by weight and about 48% by weight.

A method of manufacturing a display substrate is provided. In the method, a first metal layer including copper is formed on a base substrate, and a photo pattern is formed on the first metal layer. The first metal layer is patterned using the photo pattern as an etching stop layer and an etching composition to form a first metal pattern including a first signal line and a first electrode connected to the first signal line. The etching composition includes phosphoric acid of about 40% by weight to about 70% by weight, nitric acid of about 5% by weight to about 15% by weight, acetic acid of about 5% by weight to about 20% by weight and a remainder of water. A second metal pattern including a second signal line crossing the first signal line and a second electrode connected to the second signal line is formed. A pixel electrode connected to a thin-film transistor including the first and second electrodes is formed. The thin-film transistor is connected to the first and second signal lines.

A second metal layer including titanium may be formed under the first metal layer before forming the first metal layer, and the second metal layer may be etched using a second etching composition different from the etching composition of the first metal layer. The second etching composition may include hydrofluoric acid. Thus, the first metal pattern including the first and second metal layers may be formed.

A second metal layer including copper alloy, molybdenum or molybdenum alloy may be formed under the first metal layer before forming the first metal layer, and the second metal layer may be etched using the etching composition of the first metal layer. Thus, the first metal pattern including the first and second metal layers may be formed.

The second metal pattern may be formed via substantially the same process as the first metal pattern.

A semiconductive layer may be formed on the base substrate on which the first metal pattern is formed, and the semiconductive layer may be patterned using the etching composition of the first metal layer, and thus an active pattern is formed between the first and second electrodes. The semiconductive layer may include amorphous silicon or metal oxide.

A semiconductive layer may be formed under the first metal layer. When the first metal layer is etched, the semiconductive layer and the first metal layer may be etched using the etching composition to form the first signal line, the first electrode and an active pattern disposed between the first and second electrodes.

A copper layer may be formed on the base substrate before forming the first metal layer, and the copper layer may be patterned using the etching composition of the first metal layer to form a preliminary pattern including a preliminary signal line and a preliminary electrode connected to the preliminary signal line. The preliminary pattern is removed using the etching composition. Here, the first metal pattern may be formed on the base substrate which the preliminary pattern is removed.

The etching composition including phosphoric acid, nitric acid and acetic acid may be stably kept at a room temperature, and a number of treating substrates may be increased. That is, ability to etch the substrates may be improved. Therefore, although a thickness of a copper layer is increased, the number of the treating substrates may be maximized to improve the productivity.

In addition, the etching composition may etch a copper alloy layer, a molybdenum layer or a molybdenum alloy layer with the copper layer, so that a multi-layered metal layer may be etched whole. Further, the etching composition may etch a semiconductive layer including amorphous silicon or metal oxide with the copper layer so that process patterning the copper layer and the active layer may be simplified.

Furthermore, when a metal pattern formed by patterning the copper layer is faulty, the metal pattern is removed and a new metal pattern is formed again to reprocess the substrate using the etching composition, which does not include a fluorine-based compound. The etching composition used in removing the metal pattern may minimize patterns which are already formed before removing the metal pattern.

BRIEF DESCRIPTION OF THE DRAWINGS

The above and other features and advantages will become more apparent by describing example embodiments thereof with reference to the accompanying drawings, in which.

DETAILED DESCRIPTION OF THE INVENTION

Figure 1:
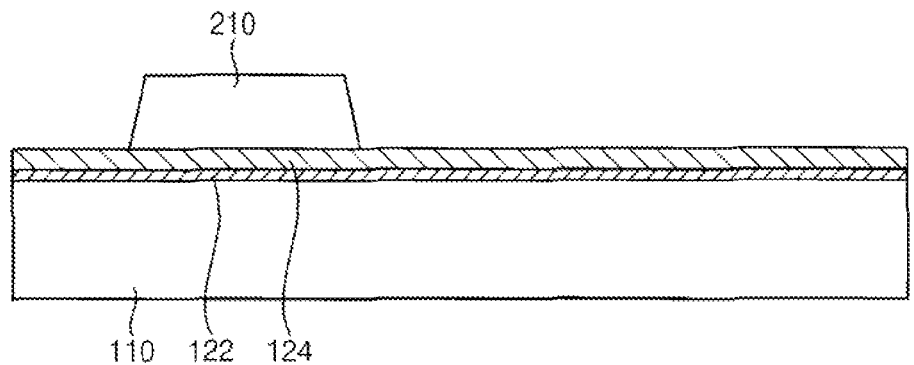
FIGS. 1 to 4 are cross-sectional views illustrating a method of manufacturing a display substrate according to an example embodiment.

Hereinafter, an etching composition and a method of manufacturing a display substrate including a pattern formed using the etching composition will be illustrated with reference to the accompanying drawings.

Etching Composition

An etching composition according to an exemplary embodiment includes phosphoric acid ($H_3PO_4$) of about 40% by weight to about 70% by weight, nitric acid ($HNO_3$) of about 5% by weight to about 15% by weight, acetic acid ($CH_3COOH$) of about 5% by weight to about 20% by weight, and a remainder of water. With respect to the amount of water, the "remainder water" means that, given a total weight of the etching composition of "100%," an amount of water is equal to 100% minus the total percent by weight of phosphoric acid, nitric acid and acetic acid. Hereinafter, each of components of the etching composition will be described.

Phosphoric Acid

Phosphoric acid is a compound substantially oxidizing copper of a copper layer.

When an amount of phosphoric acid is less than about 40% by weight based on the total weight of the etching composition, an etching rate of the copper layer is notably reduced or the copper layer is not uniformly etched. In addition, when the amount of phosphoric acid is greater than about 70% by weight, the etching composition etches excessively, so that it is difficult to control the quantity of the copper layer that is etched. When the copper layer is excessively etched, the width of the signal line formed using the copper layer is less than the width that the signal line is designed to be, such design having taken into consideration the resistance property of copper in setting the width of the signal line.

Therefore, the etching composition includes phosphoric acid between about 40% by weight and about 70% by weight based on the total weight of the etching composition. More usually, the amount of phosphoric acid may be between about 40% by weight and about 45% by weight based on the total weight of the etching composition.

Nitric Acid

Nitric acid is a compound that oxidizes copper of the copper layer and supports phosphoric acid. In addition, nitric acid may control the acidity (pH) of the etching composition that includes phosphoric acid as a main oxidizer.

When an amount of nitric acid is less than about 5% by weight based on the total weight of the etching composition, the etching rate of the copper layer is decreased, and the copper layer is etched non-uniformly. When the copper layer is non-uniformly etched, a stain may be shown. In contrast, when the amount of nitric acid is greater than about 15% by weight, nitric acid in combination with the phosphoric acid excessively etches the copper layer.

Therefore, the etching composition includes nitric acid between about 5% by weight and about 15% by weight based on the total weight of the etching composition. More usually, the amount of nitric acid may be between about 10% by weight and about 13% by weight based on the total weight of the etching composition.

Acetic Acid

Acetic acid controls the acidity of the etching composition with nitric acid, and uniformly etches the copper layer to improve the linearity of the signal line.

When an amount of acetic acid is less than about 5% by weight based on the total weight of the etching composition, the etching rate of the copper layer is decreased and the etching composition has difficulty etching the copper layer. Thus, the copper layer may remain after the etching process. When the amount of acetic acid is greater than about 20% by weight, the copper layer is excessively etched and the etching rate of the etching composition is not controlled.

Therefore, the etching composition includes acetic acid between about 5% by weight and about 20% by weight based on the total weight of the etching composition. More usually, the amount of acetic acid may be between about 12% by weight and about 15% by weight based on the total weight of the etching composition.

Water

Water includes deionized water. For example, water may have a degree of purity of water that is used for manufacturing a semiconductive, and have, for instance, a specific resistance of equal to or greater than about 18 Me/cm. Water is added to the phosphoric acid, nitric acid and acetic acid so that the total weight of the etching composition is about 100% by weight. An amount of water in the etching composition may, for example, be between about 27% by weight and about 48% by weight.

Preparation of an Etching Composition

An etching composition according to Example 1 including about 42% by weight of phosphoric acid, about 10.5% by weight of nitric acid, about 13.5% by weight of acetic acid and about 34% by weight of water was prepared. The etching composition of Example 1 does not include any one of (or collectively) a peroxide-based etchant, a persulfuric acid-based compound, or a fluorine-based compound, which are compound more conventionally used to etch copper layer.

In addition, etching compositions according to Comparative Examples 1 to 6 as listed in the following Table 1 were prepared.

TABLE 1

| Comparative Example | Component | | | |
|---|---|---|---|---|
| | Phosphoric acid | Nitric acid | Acetic acid | Water |
| 1 | 35% by weight | 10.5% by weight | 13.5% by weight | 41.5% by weight |
| 2 | 75% by weight | 10.5% by weight | 13.5% by weight | 1% by weight |
| 3 | 42% by weight | 2% by weight | 13.5% by weight | 42.5% by weight |
| 4 | 42% by weight | 18% by weight | 13.5% by weight | 26.5% by weight |
| 5 | 42% by weight | 10.5% by weight | 2% by weight | 45.5% by weight |
| 6 | 42% by weight | 10.5% by weight | 25% by weight | 22.5% by weight |

Experiment 1 for Evaluating an Etching Property of the Etching Compositions

For evaluating the etchant compositions of Example 1 and Comparative Examples 1-6, substrate Samples 1 to 7 were prepared in which a titanium layer and a copper layer were sequentially formed on a glass substrate having a size of about 550 mm×650 mm. The titanium layer had a thickness of about 200 Å and the copper layer had a thickness of about 3,000 Å. A photo pattern was formed on the copper layer.

An ETCHER (product name, AStech, Korea), which is an experimental spray type etching device, was set up at a temperature of about 40° C., and then the copper layer of each of the Samples 1 to 7 was etched for about 60 seconds using the etching compositions according to Example 1 and according to Comparative Examples 1 to 6. After the copper layer of substrate Samples 1 to 7 was etched, the titanium layer in each of substrate Samples 1 to 7 was etched using a hydrofluoric acid solution that included hydrofluoric acid and water having a dilution ratio of about 1:300.

Substrate Samples 1 to 7 were washed by deionized water, and were dried using a drying device. Then, the photo pattern in substrate Samples 1 to 7 was removed. A taper angle and a critical dimension skew ("CD skew") of the metal pattern that included the copper layer and the titanium layer were measured in each of substrate Samples 1 to 7 using an S-4700 (product name) scanning electron microscope of Hitachi Cooperation. In addition, an etching rate for each of substrate Samples 1 to 7 was measured.

Results 1 of the Evaluation of an Etching Property of the Etching Composition

In the metal pattern formed using the etching composition according to Example 1, the copper layer pattern had a taper angle in a range between about 30° and 50°, and a CD skew in a range between about 0.56 µm and about 0.76 µm. Here, an etching rate of the etching composition according to Example 1 was between about 4.5 µm/minute and about 5.5 µm/minute.

In contrast, when the copper layer of each of the substrate Samples 2 to 7 was etched by the etching compositions according to Comparative Examples 1 to 6, the etching compositions according to Comparative Examples 1, 3 and 5 did not etch the copper layer. On the other hand, the etching compositions according to Comparative Examples 2, 4 and 6 entirely removed the copper layer, although the photo pattern protected the copper layer in Samples 3, 5 and 7.

Discussion of Experiment 1 and Results 1

According to the above Experiment 1 and Results 1, when phosphoric acid of less than about 40% by weight is included in the etching composition such as Comparative Example 1, etching the copper layer is difficult. In addition, when an amount of nitric acid or acetic acid is less than about 5% by weight in the etching compositions, such as in Comparative Examples 3 and 5, etching the copper layer is difficult, even though the amount of phosphoric acid is adequate.

In addition, when phosphoric acid of greater than about 70% by weight is included in the etching composition such as Comparative Example 2, the etching rate is excessively great and is difficult to control, even though the amounts of nitric acid or acetic acid are adequate. When nitric acid of greater than about 15% by weight or acetic acid of greater than about 20% by weight is included in the etching compositions of Comparative Examples 4 and 6, the etching rate is excessively large and is difficult to control even thought the amount of phosphoric acid is adequate.

Therefore, the etching composition for the copper layer includes phosphoric acid of about 40% by weight to about 70% by weight, nitric acid of about 5% by weight to about 15% by weight, acetic acid of about 5% by weight to about 20% by weight, and a remainder of water. Because the etching composition does not etch the titanium layer, an additional etching composition including hydrofluoric acid is required for etching the titanium layer. Thus, a step for etching the titanium layer is added in a process of etching a multi-layered structure that includes a titanium layer and a copper layer. Nevertheless, because the thickness of the copper layer as a main signal line is greater than that of the titanium layer, the exposure time of the copper layer to a compound that includes fluorine is decreased when two different etching composition are used as compared to when hydrofluoric acid is added in the etching composition used for etching the copper layer. Thus, damage to the substrate can be minimized Experiment 2 for Evaluating an Etching Property of an Etching Composition Substrate Sample 8 was prepared in which a metal layer and a copper layer were sequentially formed on a glass substrate having a size of about 550 mm×650 mm. A photo pattern was formed on the copper layer. The metal layer included a copper alloy layer which was magnesium aluminum copper alloy (CuMgAl alloy) and thus that included about 2 atom % of magnesium and about 8 atom % of aluminum. The thickness of the metal layer was about 200 Å, and the thickness of the copper layer was about 3,000 Å.

Substrate Sample 9 was prepared in which a metal layer and a copper layer were sequentially formed on a glass substrate having a size of about 550 mm×650 mm. A photo pattern was formed on the copper layer. The metal layer included a CuMgAl alloy and had a thickness of about 100 Å, and the copper layer had a thickness of about 5,000 Å.

Substrate Sample 10 was prepared in which a metal layer and a copper layer were sequentially formed on a glass substrate having a size of about 550 mm×650 mm. A photo pattern was formed on the copper layer. The metal layer included a CuMgAl alloy and had a thickness of about 200 Å, and the copper layer had a thickness of about 5,000 Å.

Substrate Sample 11 was prepared in which a metal layer was formed on a glass substrate having a size of about 550 mm×650 mm. A photo pattern was formed on the metal layer. The metal layer included a CuMgAl alloy and had a thickness of about 5,000 Å.

An ETCHER (product name, AStech, Korea), which is an experimental spray type etching device, was set up at a temperature of about 40° C., then the copper layers of each of substrate Samples 8 to 11 were etched for about 60 seconds using the etching compositions according to Example 1. Substrate Samples 8 to 11 were washed with deionized water, and were dried using a drying device. Then, the photo patterns in substrate Samples 8 to 11 were removed, and a taper angle and a critical dimension skew ("CD skew") of the metal patterns including the copper layers and the titanium layers were measured in each of substrate Samples 8 to 11 using an S-4700 (product name) scanning electron microscope of Hitachi Cooperation. In addition, an etching rate for each of substrate Samples 8 to 11 was measured.

Results 2 of the Evaluation of the Etching Property of the Etching Composition

In metal patterns formed using the etching composition according to Example 1, each of the metal patterns formed on substrate Samples 8, 9 and 10 had a taper angle, respectively, in a range between about 23° and 33°, in a range between about 20° and about 30°, and in a range between about 26° and about 36°. In addition, the metal pattern formed using substrate Sample 11 and the etching composition according to Example 1 had a taper angle in a range between about 10° and about 20°.

In the metal patterns formed using the etching composition according to Example 1, each of the metal patterns formed on substrate Samples 8, 9 and 10 had a taper angle, respectively, in a range between about 0.38 μm and about 0.58 μm, in a range between about 0.27 μm and about 0.47 μm, and in a range between about 0.26 μm and about 0.36 μm. In addition, the metal pattern formed using substrate Sample 11 and the etching composition according to Example 1 had a CD skew in a range between about 0.38 μm and about 0.44 μm.

Here, an etching rate of the etching composition according to Example 1 was, respectively, between about 7.7 μm/minute and about 7.9 μm/minute for substrate Samples 8, 9 and 10, and was between about 3.4 μm/minute and about 3.5 μm/minute for substrate Sample 11.

Discussion of Experiment 2 and Results 2

According to the above Experiment 2 and Results 2, the copper alloy layer is integrally etched, that is, etched in the same etching procedure, with the copper layer using the etching composition according to present embodiments. In addition, the etching property for the copper alloy layer using the etching composition is favorable.

Experiment 3 for an Etching Property Evaluation of an Etching Composition

Substrate Sample 12 was prepared in which a molybdenum layer having a thickness of about 200 Å and a copper layer having a thickness of about 3,000 Å were sequentially formed on a glass substrate having a size of about 550 mm×650 mm. A photo pattern formed on the copper layer were prepared.

Substrate Sample 13 was prepared in which an indium gallium zinc oxide layer having a thickness of about 1,000 Å, a molybdenum layer having a thickness of about 200 Å and a copper layer having a thickness of about 3,000 Å were sequentially formed on a glass substrate having a size of about 550 mm×650 mm. A photo pattern was formed on the copper layer.

Substrate Sample 14 was prepared in which a molybdenum tungsten layer having a thickness of about 300 Å and a copper layer having a thickness of about 3,000 Å were sequentially formed on a glass substrate having a size of about 550 mm×650 mm. A photo pattern was formed on the copper layer.

An ETCHER (product name, AStech, Korea), which is an experimental spray type etching device, was set up at a temperature of about 40° C., then the copper layer of each of substrate Samples 12 to 14 was etched for about 60 seconds using the etching compositions according to Example 1. Substrate Samples 12 to 14 were washed by deionized water, and were dried using a drying device. Then, the photo pattern in substrate Samples 8 to 11 was removed, and a taper angle and a critical dimension skew ("CD skew") of the metal patterns that included the copper layer and the titanium layer were measured in each of substrate Samples 12 to 14 using S-4700 (product name) scanning electron microscope of Hitachi Cooperation.

Results 3 of the Etching Property Evaluation of the Etching Composition

In metal patterns formed using the etching composition according to Example 1, each of the metal patterns formed on substrate Samples 12 and 13 had a taper angle in a range between about 71° and 81°. In addition, the metal pattern formed using substrate Sample 14 and the etching composition according to Example 1 had a taper angle in a range between about 80° and about 90°.

In the metal patterns formed using the etching composition according to Example 1, each of the metal patterns formed on substrate Samples 12, 13 and 14 had a taper angle, respectively, in a range between about 2.85 μm and about 3.01 μm, in a range between about 2.69 μm and about 2.89 μm, and in a range between about 4.5 μm and about 5.0 μm.

Discussion of Experiment 3 and Results 3

According to the above Experiment 3 and Results 3, the molybdenum layer, the indium gallium zinc layer as a metal oxide and the molybdenum tungsten layer are integrally etched with the copper layer using the etching composition according to present embodiments. In addition, an etching property of the copper alloy layer using the etching composition is favorable.

Method of Manufacturing a Display Substrate

Hereinafter, a method of manufacturing a display substrate using the etching composition will be illustrated in detail with reference to the accompanying drawings.

FIGS. 1 to 4 are cross-sectional views illustrating a method of manufacturing a display substrate according to an example embodiment.

Referring to FIG. 1, a first metal layer 122 and a second metal layer 124 are sequentially formed on a base substrate 110, and a first photo pattern 210 is formed on the second metal layer 124.

The first metal layer 122 includes, for example, titanium, and the second metal layer 124 includes, for example, copper. Each of the first and second metal layers 122 and 124 may be entirely formed on the base substrate 110 by a sputtering process.

Figure 2:
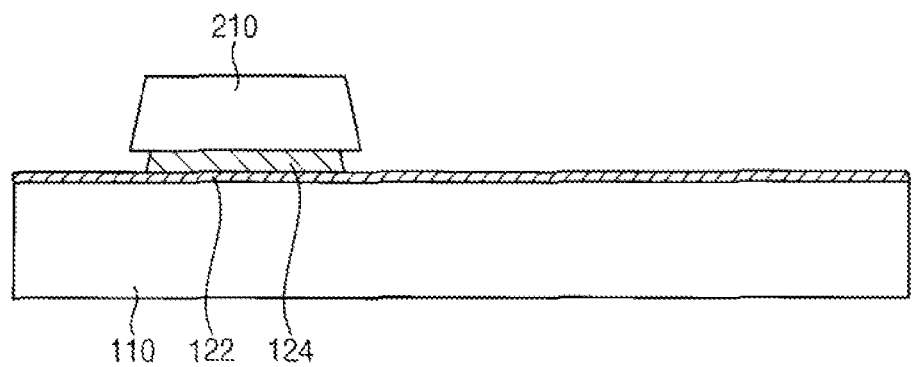

Referring to FIG. 2, the second metal layer 124 is etched using the first photo pattern 210 as an etching stop layer.

The second metal layer 124 is etched using an etching composition including phosphoric acid ($H_3PO_4$) of about 40% by weight to about 70% by weight, nitric acid ($HNO_3$) of about 5% by weight to about 15% by weight, acetic acid ($CH_3COOH$) of about 5% by weight to about 20% by weight, and a remainder of water. The etching composition of the second metal layer 124 is substantially the same as the etching composition described above. Thus, any repetitive description will be omitted. The etching composition does not include a hydrofluoric acid, so that the etching composition oxidizes the second metal layer 124, but does not oxidize the first metal layer 122.

Therefore, when the etching composition is provided to the base substrate 110, the etching composition may selectively etch the second metal 124 left exposed by the first photo pattern 210.

Figure 3:
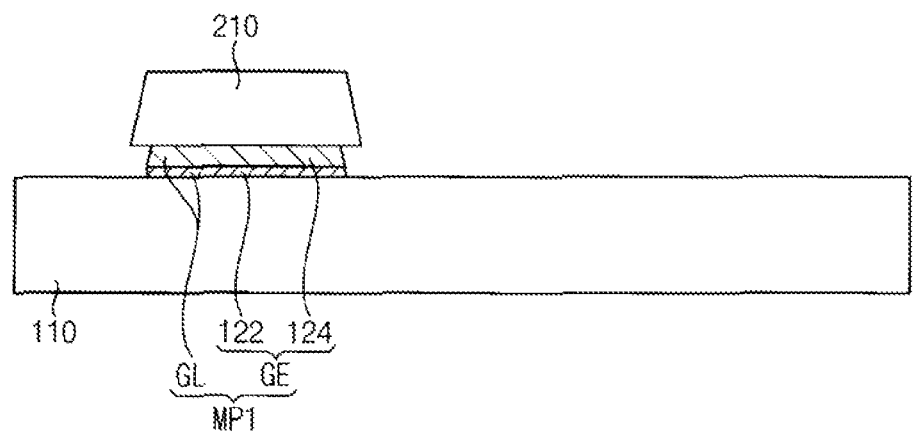

Referring to FIG. 3, the first metal layer 122 is etched using the patterned second metal layer 124 and the photo pattern 210 as an etching stop layer. The first metal layer 122 may be etched by an etching composition including hydrofluoric acid. For example, the etching composition of the first metal layer 122 may be a solution of hydrofluoric acid diluted with water to a dilution ratio between about 1:100 and about 1:400.

The first photo pattern 210 is removed to form a first metal pattern MP1 (FIG. 4) including the first metal layer 122 and the second metal layer 124. The first metal pattern MP1 includes a first signal line GL and a gate electrode GE as a first electrode of a thin-film transistor ("TFT") connected to the first signal line GL. The first signal line GL may be a gate line connected to the gate electrode GE and transmitting a gate driving signal.

According to the description illustrated in FIGS. 1 to 3, the second metal layer 124 is etched using the etching composition including phosphoric acid, nitric acid and acetic acid, and the first metal layer 122 is etched using the etching composition including hydrofluoric acid, and thus a taper angle and a critical dimension skew ("CD skew") may be easily controlled, as compared to forming the first metal pattern MP1 using an integrated etching composition for a copper layer and a titanium layer which etches both layers with the same etching composition. In addition, the amount of time that the base substrate 100 is exposed to the etching composition that includes hydrofluoric acid is much smaller than of the amount of time that the base substrate 100 is exposed to the etching composition that includes phosphoric acid, nitric acid and acetic acid. That is, when the first metal layer 122, is etched, the second metal layer 124 is also exposed to hydrofluoric acid. The first metal layer 122, however, has a thickness that is about 1/10 the thickness of the second metal layer 124, so the amount of time needed to etch the first metal layer 122 is less than that of the first metal layer 124, which reduces that amount of time that the second metal layer is exposed to the hydrofluoric acid. Thus, the etching composition of the present embodiments is used for etching the second metal layer 124, and the first metal layer 122 is etched by a different etching composition, for instance that includes hydrofluoric acid, so that the damage of the base substrate 110 and layers thereon may be minimized.

Figure 4:
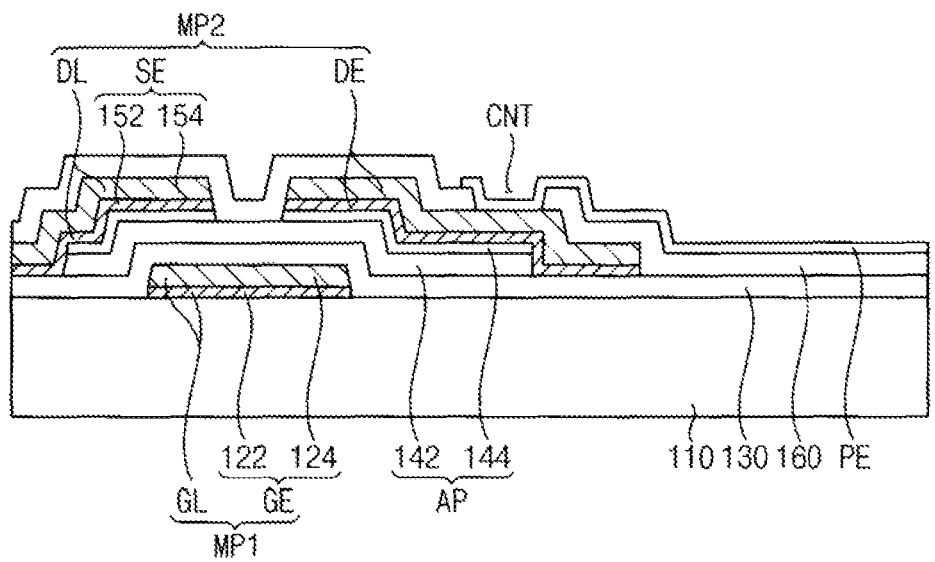

Referring to FIG. 4, a first insulating layer 130 is formed on the base substrate 110 on which the first metal pattern MP1 is formed, and an active pattern AP is formed on the first insulating layer 130 in a region corresponding to the gate electrode GE.

The active pattern AP may include a semiconductive layer 142 and an ohmic contact layer 144. The ohmic contact layer 144 may be omitted. The semiconductive layer 142 may include, for example, amorphous silicon ("a-Si") or metal oxide. The metal oxide may serve as an oxide semiconductive, for example, the metal oxide may include indium gallium zinc oxide.

Then, a second metal pattern MP2 is formed on the base substrate 110 on which the active pattern is formed. The second metal pattern MP2 includes a second signal line DL crossing the first signal line GL, a source electrode SE as a second electrode of the TFT connected to the second signal line DL, and a drain electrode DE. The second signal line DL may be a data line transmitting a data driving signal.

The second metal pattern MP2 is formed by patterning a third metal layer 152 formed on the base substrate 110 on which the active pattern AP is formed and a fourth metal layer 154 formed on the third metal layer 152. A second photo pattern (not shown) is formed on the fourth metal layer 154, and the third and fourth metal layers 152 and 154 are etched using the second photo pattern as an etching stop layer.

For example, the third metal layer 152 includes titanium, and the fourth metal layer 154 includes copper. Here, the third metal layer 152 is etched using an etching composition including hydrofluoric acid, and the fourth metal layer 154 is etched using the etching composition according to the present embodiments. A process for etching the third and fourth metal layers 152 and 154 is substantially the same as illustrated in FIGS. 2 and 3, and thus any repetitive description will be omitted.

Alternatively, the third metal layer 152 may include, for example, copper alloy, molybdenum or molybdenum alloy, etc. In such a case, the third metal layer 152 may be etched using the etching composition that is used for etching the fourth metal layer 154. Thus, the substrate 110 and layers formed thereon do not need to be exposed to an etchant, for example, hydrofluoric acid, that may be damaging to the layers formed on the substrate when the third metal layer 152 is etched.

A second insulating layer 160 is formed on the base substrate 110 on which the second metal pattern MP2 is formed, and the second insulating layer 160 on the drain electrode DE is removed to form a contact hole CNT partially exposing the drain electrode DE.

Then, a pixel electrode PE is formed on the base substrate 110 on which the contact hole CNT is formed. The pixel electrode PE makes contact with the drain electrode DE through the contact hole, and thus the pixel electrode PE is connected to the TFT.

According to the above description, although two etching steps are required in order to form the first metal pattern MP1, the second metal layer 124 is etched using different etching composition from the etching composition of the first metal layer 122 so as to improve the reliability of the etching of the second metal layer 124. In addition, the fourth metal layer 154 is etched using the etching composition of the first metal layer 122 so that the damages of the first metal pattern MP1 may be prevented in forming the second metal pattern MP2.

FIGS. 5 to 8 are cross-sectional views illustrating a method of manufacturing a display substrate according to another example embodiment.

Figure 5:
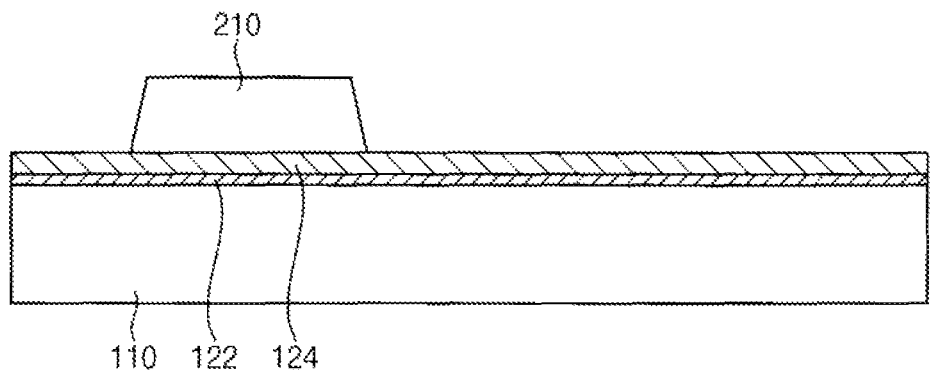
FIGS. 5 to 8 are cross-sectional views illustrating a method of manufacturing a display substrate according to another example embodiment.

Referring to FIG. 5, a first metal layer 122 and a second metal layer 124 are sequentially formed on a base substrate 110, and a first photo pattern 210 is formed on the second metal layer 124. Here, the first metal layer 122 includes, for example, copper alloy, molybdenum or molybdenum alloy, and the second metal layer 124 includes copper. The first and second metal layers 122 and 124 may be formed by a sputtering process.

Figure 6:
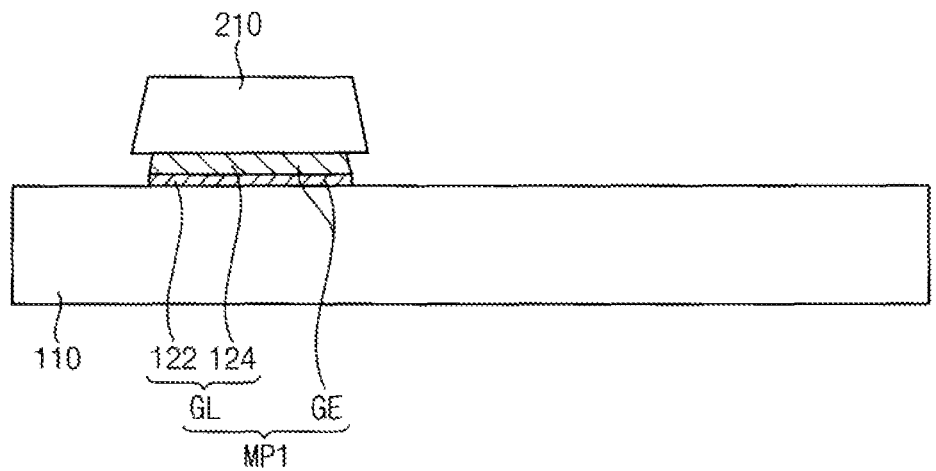

Referring to FIG. 6, the first and second metal layers 122 and 124 are patterned using the first photo pattern 210 as an etching stop layer to form a first metal pattern MP1. The first metal pattern MP1 includes (FIG. 7) a first signal line GL and a gate electrode GE. The first signal line GL serves as a gate line transmitting a gate driving signal and connected to the gate electrode GE.

The first and second metal layers 122 and 124 are etched using an etching composition including phosphoric acid ($H_3PO_4$) of about 40% by weight to about 70% by weight, nitric acid ($HNO_3$) of about 5% by weight to about 15% by weight, acetic acid ($CH_3COOH$) of about 5% by weight to about 20% by weight, and a remainder of water. The etching composition is substantially the same as the etching composition described above, and thus any repetitive description will be omitted. The first and second metal layers 122 and 124 are etched, and the first photo pattern 210 is removed.

Figure 7:
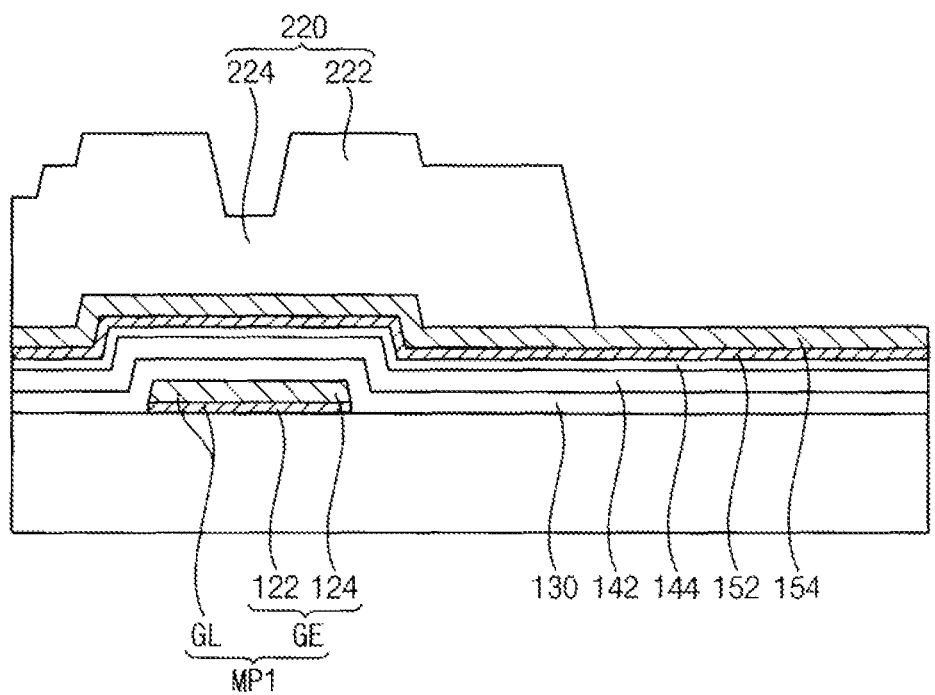

Referring to FIG. 7, a first insulating layer 130, an semiconductive layer 142, an ohmic contact layer 144, a third metal layer 152 and a fourth metal layer 154 are sequentially formed on the base substrate 110 on which the first metal pattern MP1 is formed. A second photo pattern 220 is formed on the fourth metal layer 154.

The ohmic contact layer 144 may be omitted. The semiconductive layer 142 may include, for example, amorphous silicon or metal oxide. For example, the metal oxide may include gallium indium zinc oxide. The third metal layer 152 may include, for example, copper alloy, molybdenum or molybdenum alloy. The fourth metal layer 154 may include copper.

The ohmic contact layer 144, the semiconductive layer 142, the third and fourth metal layers 152 and 154 are etched using the etching composition and the second photo pattern 220 as an etching stop layer. The etching composition of the embodiments may etch amorphous silicon or metal oxide together with a metal layer including copper or molybdenum. That, the etching composition may be an integrated etching composition that etches the ohmic contact layer 144, the semiconductive layer 142, and the third and fourth metal layers 152 and 154 in the same etch procedure.

For example, the second photo pattern 220 may include a first thickness portion 222 having a first thickness and a second thickness portion 224 having a second thickness thinner than the first thickness.

Figure 8:
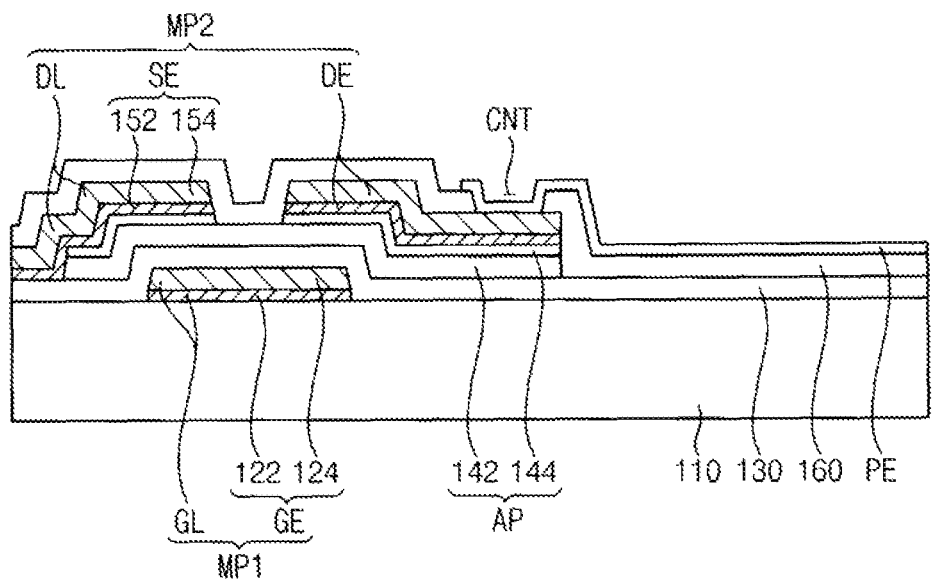

Referring to FIG. 8, the ohmic contact layer 144, the semiconductive layer 142, the third and fourth metal layers 152 and 154 are etched to form a second metal pattern MP2 and an active pattern AP.

When the second metal pattern MP2 is viewed in a plan view, the second metal pattern MP2 includes the third and fourth metal layers 152 and 154. As components, the second metal pattern MP2 includes a second signal line DL, a source electrode SE and a drain electrode DE, and the active pattern AP includes the ohmic contact layer 142 and the semiconductive layer 144.

After the ohmic contact layer 144, the semiconductive layer 142, and the third and fourth metal layers 152 and 154 are firstly etched using the etching composition of the present embodiments and the second photo pattern 220 as an etching stop layer, the second thickness portion 224 of the second photo pattern 220 is removed to form a residual pattern. The third and fourth metal layers 152 and 154 with the ohmic contact layer 144 are secondly etched using the residual pattern as an etching stop layer to form the active pattern AP and the second metal pattern MP2.

Then, a second insulating layer 160 is formed on the base substrate 110 on which the second metal pattern MP2 is formed, and a contact hole CNT is formed in the second insulating layer 160. A pixel electrode PE is formed on the base substrate 110 on which the contact hole CNT is formed so that the pixel electrode PE makes contact with the drain electrode DE. The pixel electrode PE is connected to a thin-film transistor including the gate electrode GE, the active pattern AP, the source and drain electrodes SE and DE.

Alternatively, and different from the description in FIGS. 5 and 6, the first metal layer 122 of the first metal pattern MP1 in FIG. 8 may include titanium instead of a copper ally. When the first metal layer 122 includes titanium, the first metal pattern MP1 may be formed by the process illustrated in FIGS. 1 to 3.

According to the above description, the etching composition including phosphoric acid, nitric acid and acetic acid integrally etches the ohmic contact layer 144, the semiconductive layer 142, and the third and fourth metal layers 154 and 154 to simplify the process of forming the second metal pattern MP2 and the active pattern AP. In addition, reliability of the etching process of the ohmic contact layer 144, the semiconductive layer 142, the third and fourth metal layers 152 and 154 may be improved.

In addition, in forming the first metal pattern MP1 or the second metal pattern MP2, if the first metal pattern MP1 or the second metal pattern MP2 is determined to be faulty, the etching composition can be used to remove the first or second metal pattern MP1 or MP2 to recycle the base substrate 110. For example, before forming the first metal pattern MP1, a single copper layer or a multi-layered metal layer including a copper layer is patterned to form a preliminary pattern substantially the same as the first metal pattern MP1, and if the preliminary pattern is determined to be faulty, the preliminary pattern is removed using the etching composition. Then, the first metal pattern MP1 may be formed via the processes illustrated in FIGS. 5 and 6. In forming the preliminary pattern, the preliminary pattern is a pattern trying to be formed by a user. However, in forming the first metal pattern MP1, the preliminary pattern is already the removed pattern before forming the first metal layer 122 to be a pattern previously formed by the user. The etching composition is used for a reprocess to recycle the base substrate 110 and to decrease a manufacturing cost.

Figure 9:
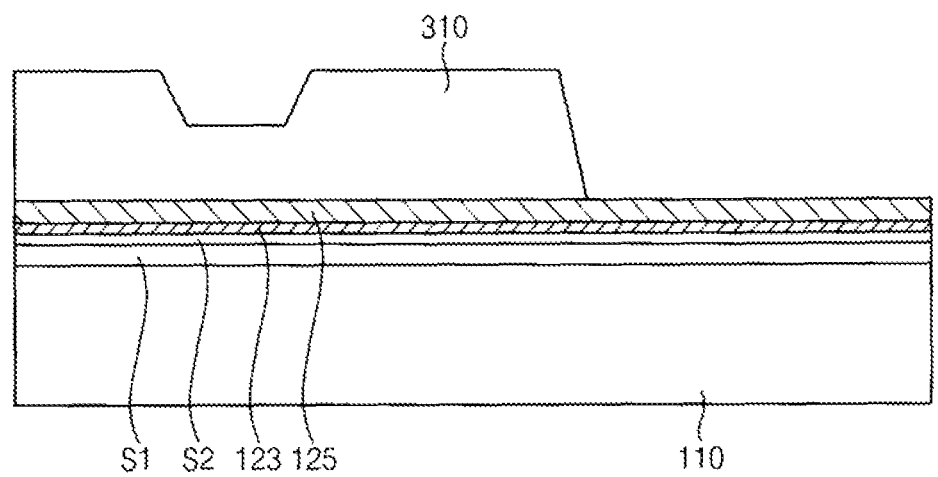
FIGS. 9 to 11 are cross-sectional views illustrating a method of manufacturing a display substrate according to still another example embodiment.
Figure 10:
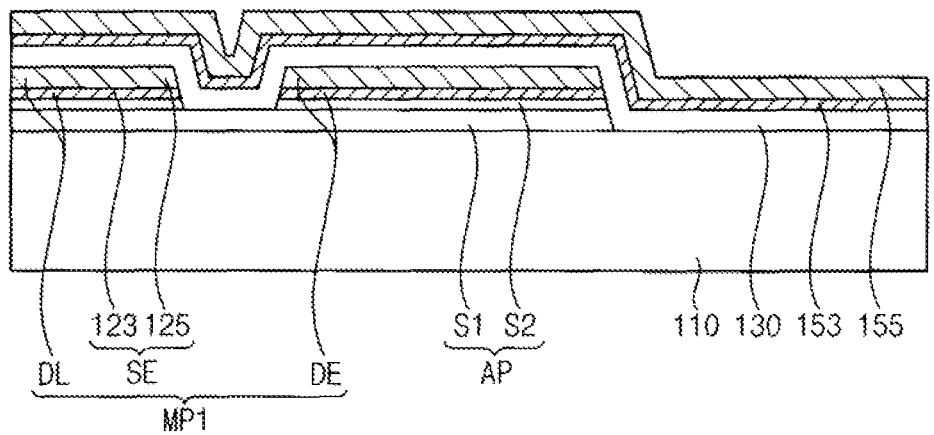
Figure 11:
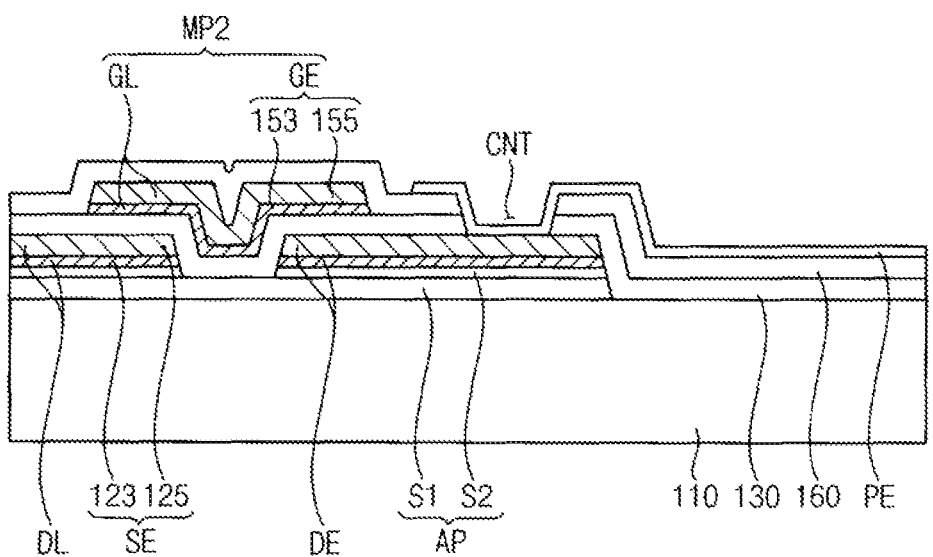

FIGS. 9 to 11 are cross-sectional views illustrating a method of manufacturing a display substrate according to still another example embodiment.

Referring to FIG. 9, a semiconductive layer S1, an ohmic contact layer S2, a first metal layer 123 and a second metal layer 125 are formed on a base substrate 110, and a first photo pattern 310 is formed on the second metal layer 125.

The shape of the first photo pattern 310 is substantially the same as the shape of the second photo pattern 220 illustrated in FIG. 7. The semiconductive layer S1 may include, for example, amorphous silicon or metal oxide. The first metal layer 123 may include, for example, copper alloy, molybdenum or molybdenum alloy, and the second metal layer 125 may include copper.

The ohmic contact layer S2, the semiconductive layer S1, and the first and second metal layers 123 and 125 are patterned using the first photo pattern 310 as an etching stop layer and an etching composition including phosphoric acid ($H_3PO_4$) of about 40% by weight to about 70% by weight, nitric acid ($HNO_3$) of about 5% by weight to about 15% by weight, acetic acid ($CH_3COOH$) of about 5% by weight to about 20% by weight, and a remainder of water. The etching composition may integrally etch the ohmic contact layer S2, the semiconductive layer S1, the first and second metal layers 123 and 125 in the same etching procedure.

Alternatively, when the first metal layer 123 includes titanium, the first metal layer 123 is etched using an etching composition of dilute hydrofluoric acid after the second metal layer 125 has been etched using the etching composition including phosphoric acid, nitric acid, acetic acid and water of the present embodiments. Then, the ohmic contact layer S2 and the semiconductive layer S1 may be etched using the etching composition of the second metal layer 125 or a different etching composition from the etching composition of the second metal layer 125.

Referring to FIG. 10, the ohmic contact layer S2, the semiconductive layer S1, and the first and second metal layers 123 and 125 are patterned to form a first metal pattern MP1 and an active pattern AP.

The first metal pattern MP1 includes a first signal line DL, a source electrode SE connected to the first signal line DL, and a drain electrode DE spaced apart from the source electrode SE. The first signal line DL may be a data line transmitting a data driving signal. The active pattern AP includes the ohmic contact layer S2 and the semiconductive layer S1.

A first insulating layer 130, a third metal layer 153 and a fourth metal layer 155 are sequentially formed on the base substrate 110 on which the first metal pattern MP1 and the active pattern AP are formed. The third metal layer 153 may include a copper alloy, molybdenum or molybdenum alloy, and the fourth metal layer 155 may include copper.

Referring to FIG. 11, the third and fourth metal layers 153 and 155 are patterned to form a second metal pattern MP2. The second metal pattern MP2 includes a second signal line GL crossing the first signal line DL, and a gate electrode GE connected to the second signal line GL. Here, the second signal line GL may be a gate line transmitting a gate driving signal. The third and fourth metal layers 153 and 155 may be etched using the etching composition used for etching the first and second metal layers 123 and 125.

Alternatively, when the third metal layer 153 includes titanium and the fourth metal layer 155 includes copper, the third metal layer 153 is etched using an etching composition that includes hydrofluoric acid after the fourth metal layer 155 has been etched using the etching composition including phosphoric acid, nitric acid and acetic acid of the present embodiments, to form the second metal pattern MP2.

A second insulating layer 160 is formed on the base substrate 110 on which the second metal pattern MP2 is formed, and the first and second insulating layers 130 and 160 on the drain electrode DE are patterned to form a contact hole CNT. A pixel electrode PE is formed on the base substrate 110 on which the contact hole CNT is formed.

According to the embodiments, the etching composition including phosphoric acid, nitric acid and acetic acid may be stably kept at a room temperature, and a number of treating substrates may be increased. That is, an etching ability capable of treating the substrates may be improved. Therefore, although a thickness of a copper layer is increased, the number of substrates that may be etched may be maximized to improve the productivity.

In addition, the etching composition may etch a copper alloy layer, a molybdenum layer or a molybdenum alloy layer with the copper layer, so that a multi-layered metal layer may be etched whole. Further, the etching composition may etch a semiconductive layer including amorphous silicon or metal oxide with the copper layer, so that process patterning the copper layer and the active layer may be simplified.

Furthermore, when a metal pattern formed by patterning the copper layer is faulty, the metal pattern is removed and a new metal pattern is formed again to reprocess the substrate using the etching composition, which does not include fluorine-based compound. The etching composition according to the present invention in removing the metal pattern may minimize patterns which are already formed before removing the metal pattern.

The foregoing is illustrative and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention. In the claims, means-plus-function clauses are intended to cover the structures described herein as performing the recited function and not only structural equivalents but also equivalent structures. Therefore, it is to be understood that the foregoing is illustrative and is not to be construed as limited to the specific example embodiments disclosed, and that modifications to the disclosed example embodiments, as well as other example embodiments, are intended to be included within the scope of the disclosure, including the appended claims.

What is claimed is:

1. An etching composition comprising:
   phosphoric acid ($H_3PO_4$) of about 40% by weight to about 45% by weight;
   nitric acid ($HNO_3$) of about 10% by weight to about 13% by weight;
   acetic acid ($CH_3COOH$) of about 12% by weight to about 15% by weight; and
   an amount of water between about 27% by weight and about 48% by weight.

2. A method of manufacturing a display substrate, the method comprising:
   forming a first metal layer including copper on a base substrate;
   forming a photo pattern on the first metal layer;
   patterning the first metal layer using the photo pattern as an etching stop layer and an etching composition including phosphoric acid of about 40% by weight to about 45% by weight, nitric acid of about 10% by weight to about 13% by weight, acetic acid of about 12% by weight to about 15% by weight and an amount of water between about 27% by weight and about 48% by weight, to form a first metal pattern including a first signal line and a first electrode connected to the first signal line;
   forming a second metal pattern including a second signal line crossing the first signal line and a second electrode connected to the second signal line; and
   forming a pixel electrode connected to a thin-film transistor including the first and second electrodes and connected to the first and second signal lines.

3. The method of claim 2, wherein the first metal pattern is formed by:
   forming a second metal layer including titanium under the first metal layer, before forming the first metal layer; and
   etching the second metal layer using a second etching composition including hydrofluoric acid after patterning the first metal layer.

4. The method of claim 2, wherein the first metal pattern is formed by:
   forming a second metal layer including a metal selected from the group consisting of copper alloy, molybdenum and molybdenum alloy under the first metal layer, and
   etching the second metal layer using the etching composition.

5. The method of claim 2, wherein forming the second metal pattern comprises:
   forming a third metal layer including copper on the base substrate on which the first metal pattern is formed; and
   patterning the third metal layer using the etching composition.

6. The method of claim 5, wherein forming the second metal pattern comprises:
   forming a fourth metal layer including titanium under the third metal layer before forming the third metal layer; and
   etching the fourth metal layer using the second etching composition including a hydrofluoric acid after patterning the third metal layer.

7. The method of claim 5, wherein forming the second metal pattern comprises:
   forming a fourth metal layer including a metal selected from the group consisting of copper alloy, molybdenum and molybdenum alloy,
   etching the fourth metal layer using the etching composition.

8. The method of claim 2, further comprising:
forming a semiconductive layer on the base substrate on which the first metal pattern is formed; and
patterning the semiconductive layer using the etching composition to form an active pattern between the first electrode and the second electrode.

9. The method of claim 8, wherein the semiconductive layer comprises at least one of amorphous silicon and metal oxide.

10. The method of claim 9, wherein the metal oxide comprises gallium indium zinc oxide ("GIZO").

11. The method of claim 2, further comprising: forming a semiconductive layer under the first metal layer; and
wherein etching the first metal layer comprises etching the semiconductive layer and the first metal layer using the etching composition to form the first signal line, the first electrode and an active pattern between the first and second electrodes.

12. The method of claim 11, wherein the semiconductive layer comprises at least one of amorphous silicon and metal oxide.

13. The method of claim 2, further comprising:
forming a copper layer on the base substrate before forming the first metal layer;
patterning the copper layer using the etching composition to form a preliminary pattern including a preliminary signal line and a preliminary electrode connected to the preliminary signal line; and
removing the preliminary pattern using the etching composition,
wherein the first metal pattern is formed on the base substrate from which the preliminary pattern is removed.

* * * * *